(12) United States Patent
Li

(10) Patent No.: US 10,847,520 B2
(45) Date of Patent: Nov. 24, 2020

(54) STATIC RANDOM ACCESS MEMORY AND FABRICATION METHODS THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Yong Li, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 16/050,566

(22) Filed: Jul. 31, 2018

(65) Prior Publication Data

US 2019/0043867 A1 Feb. 7, 2019

(30) Foreign Application Priority Data

Aug. 2, 2017 (CN) .......................... 2017 1 0651016

(51) Int. Cl.
*H01L 27/11* (2006.01)
*H01L 29/78* (2006.01)
(Continued)

(52) U.S. Cl.
CPC .. *H01L 27/1104* (2013.01); *H01L 21/823814* (2013.01); *H01L 21/823821* (2013.01);
(Continued)

(58) Field of Classification Search
None
See application file for complete search history.

(56) References Cited

U.S. PATENT DOCUMENTS 9,166,024 B2 10/2015 Hung et al.
2014/0306296 A1* 10/2014 Jeon ..................... H01L 27/1104
257/401
(Continued)

FOREIGN PATENT DOCUMENTS

| CN | 101414621 A | 4/2009 |
| CN | 101414632 A | 4/2009 |
| CN | 106684087 A | 5/2017 |

*Primary Examiner* — Joseph C. Nicely
*Assistant Examiner* — Lamont B Koo
(74) *Attorney, Agent, or Firm* — Anova Law Group, PLLC

(57) ABSTRACT

A method for fabricating an SRAM includes forming a plurality of first fin structures, a plurality of second fin structures, and an isolation layer. Each first fin structure is adjacent to a second fin structure and includes a first replacement region exposed by the isolation layer. The method includes forming pull down (PD) transistors, including forming PD gate structures to partially cover the first fin structures; forming a fin sidewall film on sidewall surfaces of each first replacement region; forming a first PD dielectric layer, exposing each first replacement region, to cover sidewall surfaces of the fin sidewall film; removing the first replacement region and the fin sidewall film on sidewall surfaces of the first replacement region; and forming a first source/drain doped layer. The method also includes forming adjacent transistors, including forming a second source/drain doped layer in the second fin structures adjacent to the first source/drain doped layer.

14 Claims, 8 Drawing Sheets

(51) Int. Cl.
*H01L 29/06* (2006.01)
*H01L 29/08* (2006.01)
*H01L 21/8238* (2006.01)
*H01L 29/66* (2006.01)
*G11C 11/412* (2006.01)

(52) U.S. Cl.
CPC .... *H01L 29/0649* (2013.01); *H01L 29/66545* (2013.01); *G11C 11/412* (2013.01); *H01L 29/7848* (2013.01)

(56) References Cited

U.S. PATENT DOCUMENTS

2016/0211338 A1* 7/2016 Wang ................ H01L 29/41791
2017/0133386 A1* 5/2017 Lee ................. H01L 21/823807
2017/0365522 A1* 12/2017 Jeong ............. H01L 21/823814

\* cited by examiner

| | |
|---|---|
| Providing a semiconductor substrate including a pull-down (PD) region and a pull-up (PU) region, forming a plurality of first fin structures on the semiconductor substrate in the PD region, and forming a plurality of second fin structures on the semiconductor substrate in the PU region | S401 |
| Forming a plurality of PD gate structures across the plurality of first fin structures, and a plurality of PU gate structures across the plurality of second fin structures, each first fin structure including a first non-replacement region covered by the PD gate structures, and a first replacement region not covered by the PD gate structures | S402 |
| Forming a fin sidewall film on the sidewall surfaces of the first replacement region of each first fin structure and also on the surface of the isolation layer | S403 |
| Forming a first PD dielectric layer on the isolation layer to cover the sidewall surfaces of the fin sidewall film and expose the top surface of the first replacement region of each first fin structure, a PU dielectric layer on the isolation layer to cover the fin sidewall film of the PU region | S404 |
| Removing the first replacement region of each first fin structure and the portion of the fin sidewall film formed on the sidewall surfaces of the first replacement region to form a first trench | S405 |
| Forming a first source/drain doped layer in the first trench | S406 |
| Forming a second PD dielectric layer on the first source/drain doped layer and the first PD dielectric layer, removing the PD gate structure to form a PD gate opening, forming a PD metal gate structure in the PD gate opening, removing the PU gate structure to form a PU opening, and forming a PU metal gate structure in the PU gate opening | S407 |
| Forming a top dielectric layer on the PD region and the PU region, forming a plurality of PD trenches through the second PD dielectric layer and the top dielectric layer to expose the top surface of the first source/drain doped layer, and forming a plurality of PU trenches through the PU dielectric layer and the top dielectric layer to expose the top surface of each second fin structure | S408 |
| Performing an ion implantation process on the portion of each second fin structure exposed by the PU trench to form a second source/drain doped layer next to the first source/drain dope layer | S409 |
| Forming a PD plug in each PD trench, and a PU plug in each PU trench | S410 |

FIG. 20

STATIC RANDOM ACCESS MEMORY AND FABRICATION METHODS THEREOF

CROSS-REFERENCES TO RELATED APPLICATIONS

This application claims the priority of Chinese Patent Application No. CN201710651016.2, filed on Aug. 2, 2017, the entire content of which is incorporated herein by reference.

FIELD OF THE DISCLOSURE

The present disclosure generally relates to the field of semiconductor fabrication technology and, more particularly, relates to fingerprint sensors and fabrication methods thereof

BACKGROUND

With the continuous development of semiconductor technology, the development of memories is trending towards achieving high integration level, rapid operation, and low power consumption.

Based on the functions, memories can be categorized into random access memories (RAMs) and read only memories (ROMs). When a RAM operates, data can be read from any given address at any time, and can also be written to any specified memory cell at any time. That is, it is convenient and flexible for a RAM to perform the read and/or write operations.

The RAMs further include static random access memories (SRAMs) and dynamic random access memories (DRAMs). The SRAMs use triggers with positive feedback to realize data storing. An SRAM primarily relies on a continuous power to maintain the integrity of data, but does not need to be refreshed once it is in use. Therefore, SRAMs have been widely used in computer caching and frequent data processing.

However, the electrical performance of existing SRAMs may still need to be improved. The disclosed SRAMS and fabrication methods thereof are directed to solve one or more problems set forth above and other problems in the art.

BRIEF SUMMARY OF THE DISCLOSURE

One aspect of the present disclosure provides a method for fabricating a static random access memory (SRAM). The method includes providing a semiconductor substrate; and forming a plurality of first fin structures, a plurality of second fin structures, and an isolation layer on the semiconductor substrate. Each first fin structure is adjacent to a second fin structure, the isolation layer covers a portion of sidewall surfaces of each first fin structure, and a portion of each first fin structure exposed by the isolation layer includes a first replacement region. The method also includes forming a plurality of pull down (PD) transistors; and forming a plurality of adjacent transistors. Forming the plurality of PD transistors includes forming a plurality of PD gate structures across the plurality of first fin structures. Each PD gate structure covers a portion of a top and sidewall surfaces of a first fin structure, and the first replacement region is located on both sides of each PD gate structure. Forming the plurality of PD transistors also includes forming a fin sidewall film on sidewall surfaces of the first replacement region of each first fin structure and on a top surface of the isolation layer; forming a first PD dielectric layer on the isolation layer to cover sidewall surfaces of the fin sidewall film and expose a top surface of the first replacement region of each first fin structure; removing the first replacement region of each first fin structure and a portion of the fin sidewall film formed on sidewall surfaces of the first replacement region to form a first trench; and forming a first source/drain doped layer in the first trench. Forming the plurality of adjacent transistors includes forming a second source/drain doped layer in the plurality of second fin structures. The second source/drain doped layer is adjacent to the first source/drain doped layer.

Another aspect of the present disclosure provides an SRAM. The SRAM includes a semiconductor substrate; a plurality of PD transistors, each including a first fin structure formed on the semiconductor substrate, a PD gate structure formed across the first fin structure and covering a portion of a top and sidewall surfaces of the first fin structure, and a first source/drain doped layer formed in the first fin structure on both sides of the PD gate structure; and a plurality of adjacent transistors, each including a second fin structure formed on the semiconductor substrate and a second source/drain doped layer formed in the second fin structure. The second source/drain doped layer is adjacent to the first source/drain doped layer of a PD transistor. The SRAM also includes an isolation layer, formed on the semiconductor substrate and covering a portion of a top and sidewall surfaces of each first fin structure; a fin sidewall film, formed on the isolation layer and covering sidewall surfaces of each PD gate structure; and a first PD dielectric layer, formed on the isolation layer and covering sidewall surfaces of the first source/drain doped layer.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

FIG. 20 illustrates a flowchart of an exemplary method for fabricating an SRAM consistent with various embodiments of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

Figure 1:
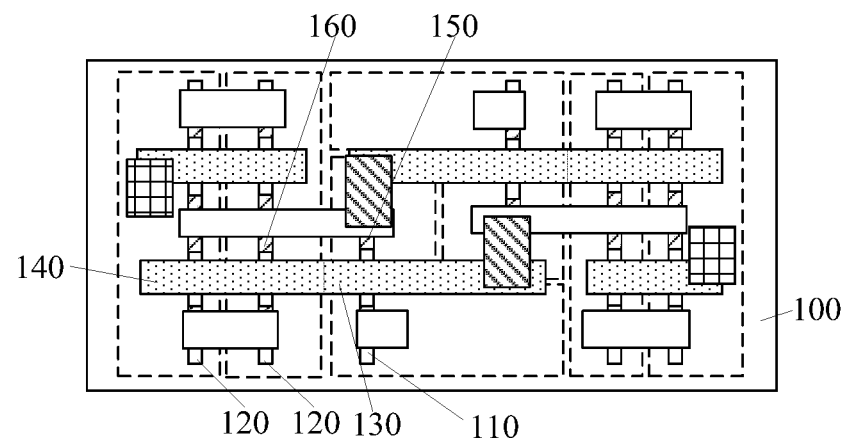
FIG. 1 illustrates a schematic structural view of a static random access memory (SRAM)

FIG. 1 illustrates a schematic structural view of a static random access memory (SRAM). Referring to FIG. 1, the method includes providing a semiconductor substrate 100. A plurality of first fin structures 110 and a plurality second fin structures 120 are formed on the semiconductor substrate 100. Each first fin structure 110 is adjacent to a second fin structure 120. In addition, an isolation layer covering a portion of the sidewall surfaces of each first fin structure 110 and a portion of the sidewall surfaces of each second fin structure 120 is formed on the substrate 100. The method also includes forming a plurality of pull-down (PD) transistors, and forming a plurality of pull-up (PU) transistors. The plurality of PD transistors are formed by a method including forming a PD gate structure 130 on the isolation layer across each first fin structure 110, and forming a first source/drain doped layer 150 in the first fin structure 110 on both sides of each PD gate structure 130. The plurality of PU transistors are formed by a method including forming a PU gate structure 140 on the isolation layer across each second fin structure 120, and forming a second source/drain doped layer 160 in the second fin structure 120 on both sides of each PU gate structure 140. The second source/drain doped layer 160 and the first source/drain doped layer 150 are adjacent to each other.

However, the performance of the SRAMs formed by the method described above may be poor. The reasons that lead to the undesired performance of the SRAMs are the following.

The material layer of the first source/drain doped layer 150 is formed through an epitaxial growth process, and the growth rate of the first source/drain doped layer 150 may vary along different growth directions. As such, the first source/drain doped layer 150 protrudes outward in the width direction of the first fin structure 110. That is, in the width direction of the first fin structure 110, the first source/drain doped layer 150 has a tip on both sides. In addition, the material layer of the second source/drain doped layer 160 is also formed through an epitaxial growth process, and the growth rate of the second source/drain doped layer 160 may vary along different growth directions. As such, the second source/drain doped layer 160 protrudes outward in the width direction of the second fin structure 120. That is, in the width direction of the second fin structure 120, the second source/drain doped layer 160 has a tip on both sides.

As the feature size of semiconductor devices continuously decreases, the space between the second source/drain doped layer 160 and the first source/drain doped layer 150 becomes smaller and smaller. Therefore, the second source/drain doped layer 160 and the first source/drain doped layer 150 may be easily connected together, and thus, a bridging connection between the voltage applied on the second source/drain doped layer 160 and the voltage applied on the first source/drain doped layer 150 may likely take place.

The present disclosure provides a method for fabricating an SRAM with improved electrical performance. FIG. 20 illustrates a flowchart of an exemplary method for fabricating an SRAM consistent with various embodiments of the present disclosure. FIGS. 2-19 illustrate schematic views of semiconductor structures at certain stages of the exemplary fabrication method.

Figure 2:
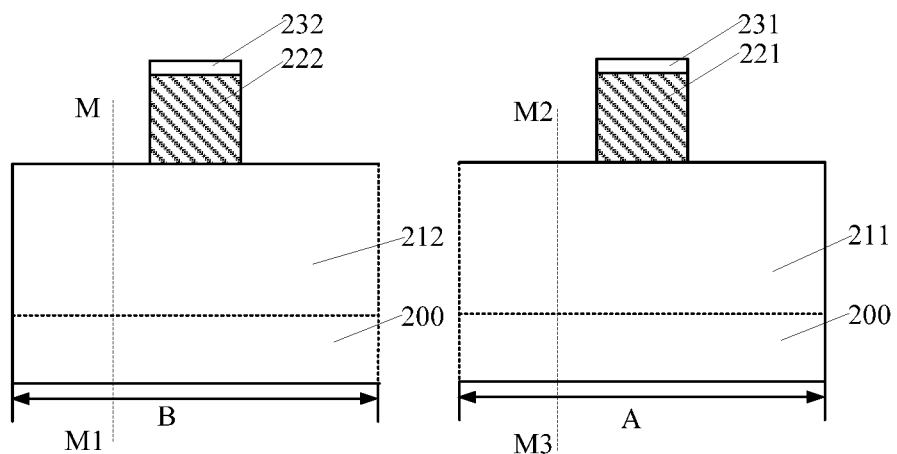
FIGS. 2-19 illustrate schematic views of semiconductor structures at certain stages of an exemplary fabrication method for an SRAM consistent with various embodiments of the present disclosure.
Figure 3:
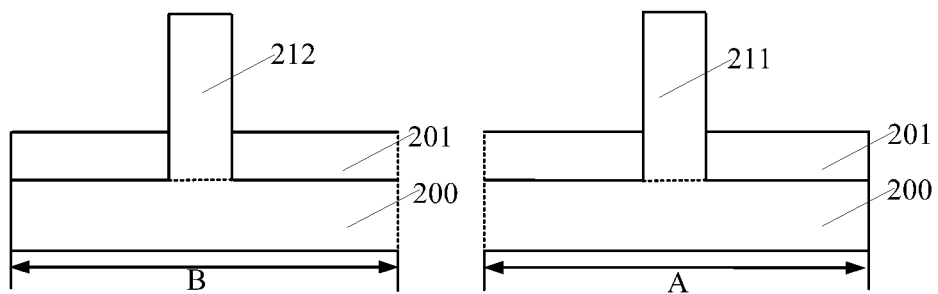

Referring to FIG. 20, at the beginning of the fabrication process, a semiconductor substrate, including a pull-down (PD) region and a pull-up (PU) region, may be provided, a plurality of first fin structures may be formed on the semiconductor substrate in the PD region, and a plurality of second fin structures may be formed on the semiconductor substrate in the PU region (S401). FIGS. 2-3 illustrate schematic cross-section views of a semiconductor structure consistent with some embodiments of the present disclosure. FIG. 2 illustrates schematic cross-section views of the semiconductor structure in the length direction of a first fin structure in region A, and in the length direction of a second fin structure in region B, respectively. FIG. 3 illustrates schematic cross-section views of the semiconductor structure along an M-M1 line (shown in FIG. 2), and along an M2-M3 line (shown in FIG. 2), respectively.

Referring to FIGS. 2-3, a semiconductor substrate 200 may be provided. The semiconductor substrate 200 may include a PD region A and a PU region B. A plurality of first fin structures 211 may be formed on the PD region A of the semiconductor substrate 200, and a plurality of second fin structures 212 may be formed on the PU region B of the semiconductor substrate. As shown in FIG. 2 and FIG. 3, only one first fin structure 211 and one second fin structure 212 are provided as examples for further illustration of the disclosed fabrication process.

In one embodiment, each first fin structure 211 may be adjacent to a second fin structure 212. An isolation layer 201 may be formed on the semiconductor substrate 200 to cover a portion of the sidewall surfaces of each first fin structure 211 as well as a portion of the sidewall surfaces of each second fin structure 212. The portion of the first fin structures 211 exposed by the isolation layer 201 may include a plurality of first replacement regions (not shown).

The semiconductor substrate 200 may be made of single-crystalline silicon, polycrystalline silicon, or amorphous silicon. Alternatively, the semiconductor substrate 200 may be made of germanium, SiGe, or any other appropriate semiconductor materials, or may have any appropriate composite semiconductor structure, such as silicon on insulator (SOI), germanium on insulator (GOI), etc. In one embodiment, the semiconductor substrate 200 is made of single-crystalline silicon.

The semiconductor substrate 200 may include a PD region A used to form a plurality of PD transistors for the SRAM. In one embodiment, each PD transistor may be next to an adjacent transistor. In practical applications, the type of the adjacent transistor may be determined according to the circuit layout of the SRAM to be formed. In one embodiment, the adjacent transistor may be a PU transistor, and the semiconductor substrate 200 may also include a PU region B. The PU region B may be used to form a plurality of PU transistors for the SRAM. In one embodiment, the plurality of PU transistors may be P-type and the plurality of PD transistors may be N-type.

The plurality of first fin structures 211 may be formed on the PD region A of the semiconductor substrate 200, and the plurality of second fin structures 212 may be formed on the PU region B of the semiconductor substrate 200.

The isolation layer 201 may be formed on both the PD region A and the PU region B of the semiconductor substrate 200. The isolation layer 202 may also cover a portion of the sidewall surfaces of each second fin structure 212. The top surface of the isolation layer 201 may be lower than the top surfaces of the plurality of first fin structures 211 and the top surfaces of the plurality of second fin structures 212. The isolation layer 201 may be made of a material including $SiO_x$.

The portion of the first fin structures 211 exposed by the isolation layer 201 may also include a plurality of first non-replacement regions (not labeled). A first replacement region and may be next to a first non-replacement region, and any two adjacent first replacement regions may be separated by a first non-replacement region. That is, any two adjacent first replacement regions may be located on the two sides of a corresponding first non-replacement region, respectively. A direction from a first replacement region to a first non-replacement region may be parallel to the extending direction of the plurality of first fin structures 211.

The portion of the second fin structures 212 exposed by the isolation layer 201 may also include a plurality of second replacement regions (not labeled) and a plurality of second non-replacement regions (not labeled). A second replacement region and may be next to a second non-replacement region, and any two adjacent second replacement regions may be separated by a second non-replacement region. That is, any two adjacent second replacement regions may be located on the two sides of a corresponding second non-replacement region, respectively. A direction from a second replacement region to a second non-replacement region may be parallel to the extending direction of the plurality of second fin structures 212.

In one embodiment, the semiconductor substrate 200 may also include a logic region. The logic region may be used to form a plurality of logic devices for the SRAM. For example, the logic region may include a first logic region (not labeled), and a second logic region (not labeled). The type of the transistors to be formed in the first logic region may be the same as the type of the plurality of PD transistors, and the type of the transistors to be formed in the second logic region may be opposite to the type of the plurality of PD transistors.

A plurality of third fin structures (not shown) may be formed on the first logic region of the semiconductor substrate 200, and the isolation layer 201 may also cover a portion of the sidewall surfaces of each third fin structure formed on the first logic region of the semiconductor substrate 200. The portion of the third fin structures exposed by the isolation layer 201 may include a plurality of third replacement regions and a plurality of third non-replacement regions with each third replacement region next to a third non-replacement region. That is, any two adjacent third replacement regions may be located on the two sides of a corresponding third non-replacement region, respectively. A direction from a third replacement region to a third non-replacement region may be parallel to the extending direction of the plurality of third fin structures.

A plurality of fourth fin structures (not shown) may be formed on the second logic region of the semiconductor substrate 200, and the isolation layer 201 may also cover a portion of the sidewall surfaces of each fourth fin structure formed on the second logic region of the semiconductor substrate 200. The portion of the fourth fin structures exposed by the isolation layer 201 may include a plurality of fourth replacement regions and a plurality of fourth non-replacement regions with each fourth replacement region next to a fourth non-replacement region. That is, any two adjacent fourth replacement regions may be located on the two sides of a corresponding fourth non-replacement region, respectively. A direction from a fourth replacement region to a fourth non-replacement region may be parallel to the extending direction of the plurality of fourth fin structures.

The first fin structures 211, the second fin structures 212, the third fin structures, and the fourth fin structures may be made of single-crystalline silicon or single-crystalline SiGe.

Further, a plurality of PD transistors and a plurality of adjacent transistors may be formed. The method for forming the plurality of PD transistors may include the following exemplary steps. A plurality of PD gate structures may be formed across the plurality of first fin structures 211. The plurality of PD gate structures may cover a portion of the top and the sidewall surfaces of each first fin structure 211. The plurality of first replacement regions may be located on both sides of each PD gate structure. A fin sidewall film may be formed on the sidewall surfaces of the first replacement region of each first fin structure 211 and on the surface of the isolation layer 201. A first PD dielectric layer may be formed on the isolation layer 201 in the PD region A. The first PD dielectric layer may cover the sidewall surfaces of the fin sidewall film and expose the top surface of the first replacement region of each first fin structure 211. Further, the first replacement region of each first fin structure 211 and the portion of the fin sidewall film formed on the sidewall surfaces of the first replacement region of the first fin structure 211 may be removed to form a first trench. A first source/drain doped layer may be formed in the first trench. The method for forming the plurality of adjacent transistors may include forming a second source/drain doped layer in the plurality of the second fin structures 212. The second source/drain doped layer may be next to the first source/drain doped layer.

For example, returning to FIG. 20, a plurality of PD gate structures and a plurality of PU gate structures may be formed (S402). Referring to FIGS. 2-3, a plurality of PD gate structures 211 may be formed on the isolation layer 201 and the semiconductor substrate 200. The plurality of PD gate structures may be formed across the first non-replacement region of each first fin structure 211 and cover the top and the sidewall surfaces of the first non-replacement region of the first fin structure 211. A plurality of PU gate structure 222 may be formed on the isolation layer 201 and the semiconductor substrate 200. The plurality of PU gate structures may be formed across the second non-replacement region of each second fin structure 212 and cover the top and the sidewall surfaces of the second non-replacement region of the second fin structure 212.

Each PD gate structure 221 may include a first gate dielectric layer formed across a corresponding first fin structure 211, and a first gate electrode layer formed on the first gate dielectric layer. Each PU gate structure 222 may include a second gate dielectric layer formed across a corresponding second fin structure 212, and a second gate electrode layer formed on the second gate dielectric layer. The first gate dielectric layer may be formed on a portion of the surface of the isolation layer 201 in the PD region A, and cover the top and the sidewall surfaces of the first non-replacement region of the first fin structure 211. The second gate dielectric layer may be formed on a portion of the surface of the isolation layer 201 in the PU region B, and cover the top and the sidewall surfaces of the second non-replacement region of the second fin structure 212. The first gate dielectric layer and the second gate dielectric layer may be made of $SiO_x$, and the first gate electrode layer and the second gate electrode layer may be made of polycrystalline silicon.

In one embodiment, a first gate protection layer 231 may be formed on the top surfaces of the plurality of PD gate structures 221, and a second gate protection layer 232 may be formed on the top surfaces of the plurality of PU gate structures 222. The first gate protection layer 231 and the second gate protection layer 232 may be made of SiN, SiCN, SiBN, or SiON.

In one embodiment, a plurality of first logic gate structures (not shown) may also be formed on the isolation layer 201 and the semiconductor substrate 200. The plurality of first logic gate structures may be formed across the third non-replacement region of each third fin structure and cover the top and the sidewall surfaces of the third non-replacement region of the third fin structure. In addition, a plurality of second logic gate structure may be formed on the isolation layer 201 and the semiconductor substrate 200. The plurality of second logic gate structures may be formed across the fourth non-replacement region of each fourth fin structure and cover the top and the sidewall surfaces of the fourth non-replacement region of the fourth fin structure.

Each first logic gate structure may include a third gate dielectric layer formed across a corresponding third fin structure, and a third gate electrode layer formed on the third gate dielectric layer. Each second logic gate structure may include a fourth gate dielectric layer formed across a corresponding fourth fin structure, and a fourth gate electrode layer formed on the fourth gate dielectric layer. The third gate dielectric layer may be formed on a portion of the surface of the isolation layer 201 in the first logic region, and cover the top and the sidewall surfaces of the third non-replacement region of the third fin structure. The fourth gate dielectric layer may be formed on a portion of the surface of the isolation layer 201 in the second logic region, and cover the top and the sidewall surfaces of the fourth non-replacement region of the fourth fin structure. The third gate dielectric layer and the fourth gate dielectric layer may be made of $SiO_x$, and the third gate electrode layer and the fourth gate electrode layer may be made of polycrystalline silicon.

In one embodiment, a third gate protection layer (not shown) may be formed on the top surfaces of the plurality of first logic gate structures, and a fourth gate protection layer (not shown) may be formed on the top surfaces of the plurality of second logic gate structures. The third gate protection layer and the fourth gate protection layer may be made of SiN, SiCN, SiBN, or SiON.

Figure 4:
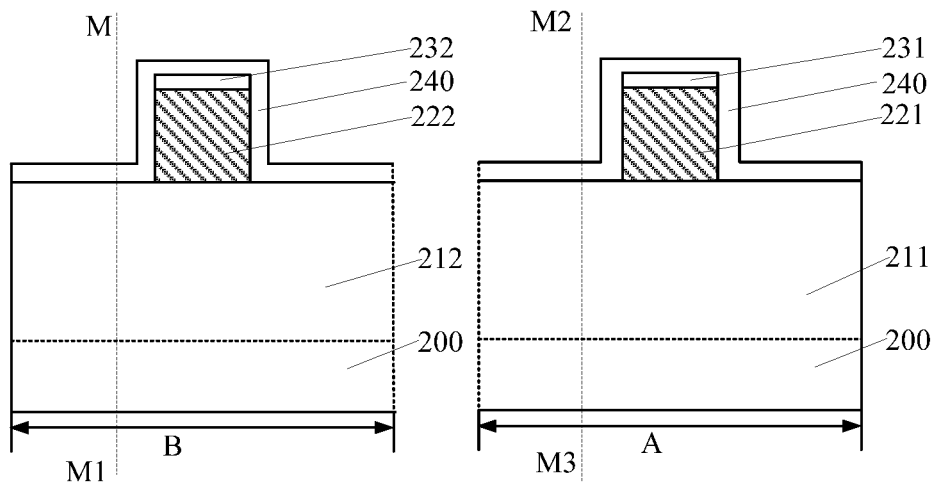
Figure 5:
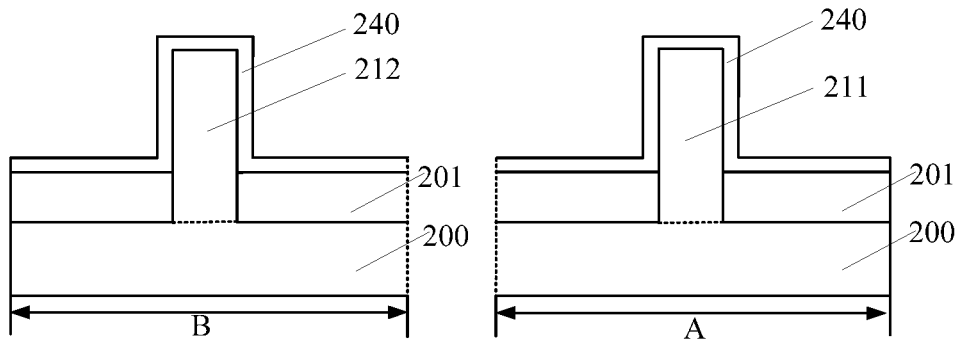

Further, returning to FIG. 20, a fin sidewall film may be formed on the sidewall surfaces of the first replacement region of each first fin structure and also on the surface of the isolation layer (S403). FIGS. 4-5 illustrate schematic cross-section views of a semiconductor structure consistent with some embodiments of the present disclosure. Specifically, FIG. 4 illustrates a schematic cross-section view processed from the cross-section view shown in FIG. 2, and FIG. 5 illustrates a schematic cross-section view processed from the cross-section view shown in FIG. 3.

Referring to FIGS. 4-5, a fin sidewall film 240 may be formed on the sidewall surfaces of the first replacement region of each first fin structure 211 and also on the surface of the isolation layer 201.

The fin sidewall film 240 in the PD region A may also be formed on the top surface of the first replacement region of each first fin structure 211, the top and the sidewall surfaces of each PD gate structure 212, and the surface of the isolation layer in the PD region A. The fin sidewall film 240 may also be formed on the top and sidewall surfaces of the second replacement region of each second fin structure 212, the top and the sidewall surfaces of each PU gate structure 222, and the surface of the isolation layer 201 in the PU region B.

In one embodiment, when the semiconductor substrate includes the first logic region, the fin sidewall film 240 may also be formed on the top and sidewall surfaces of the third replacement region of each third fin structure, the top and the sidewall surfaces of each first logic gate structure, and the surface of the isolation layer 201 in the first logic region. When the semiconductor substrate includes the second logic region, the fin sidewall film 240 may also be formed on the top and sidewall surfaces of the fourth replacement region of each fourth fin structure, the top and the sidewall surfaces of each second logic gate structure, and the surface of the isolation layer 201 in the second logic region.

In one embodiment, the semiconductor structure may also include the first protective layer 231, the second protective layer 232, the third protective layer, and the fourth protective layer, and accordingly, the fin sidewall film 240 may also cover the first protective layer 231, the second protective layer 232, the third protective layer, and the fourth protective layer.

The fin sidewall film 240 may be made of SiN, SiCN, SiBN, or SiON. The process for forming the fin sidewall film 240 may be a deposition process, such as an atomic layer deposition (ALD) process or a plasma chemical vapor deposition (CVD) process.

In one embodiment, the thickness of the fin sidewall film 240 may be approximately 15% to 30% of the width of the first replacement region. The reason to select the thickness of the fin sidewall film 240 in the above range is to provide a relatively large growth space for the subsequently-formed first source/drain doped layer. As such, the process requirements may be satisfied, and the process cost may be reduced. Therefore, having the thickness of the fin sidewall film 240 in a range of approximately 15% to 30% of the width of the first replacement region may be able to effectively reduce the probability that the first source/drain doped layer and the second source/drain doped layer become to connect with each other in a subsequent process.

For example, the width of the first replacement region may be in a range of approximately 5 nm to 15 nm; the distance between a first fin structure 211 and an adjacent second fin structure 212 may be in a range of approximately 5 nm to 45 nm, e.g., 10 nm, 15 nm, 20 nm, 25 nm, 30 nm, or 40 nm; the thickness of the fin sidewall film 240 formed on the sidewall surfaces of the first replacement region may be in a range of approximately 3 nm to 10 nm, e.g., 3 nm, 6 nm, 8 nm, or 10 nm.

In one embodiment, the width of the first replacement region may be 10 nm, the distance between a first fin structure 211 and an adjacent second fin structure 212 may be 20 nm, and the thickness of the fin sidewall film 240 formed on the sidewall surfaces of the first replacement region may be 6 nm.

Figure 6:
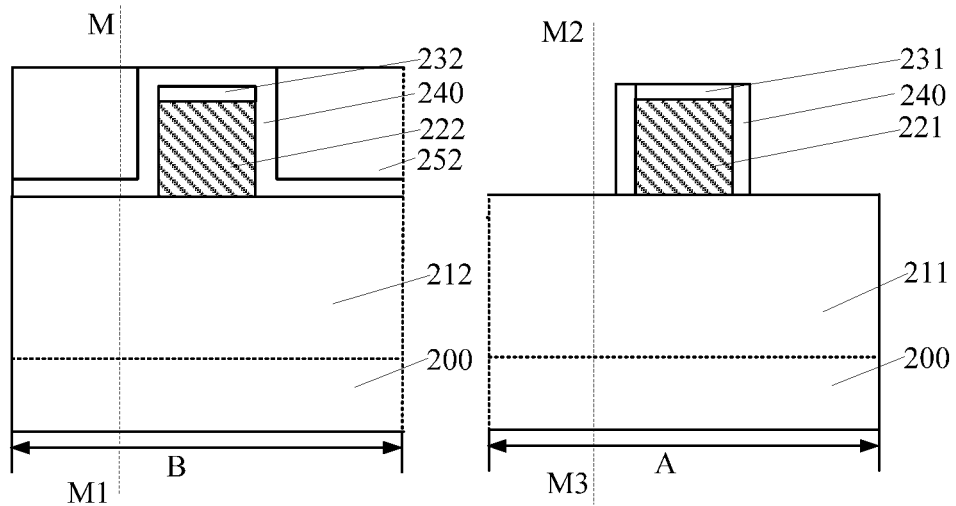
Figure 7:
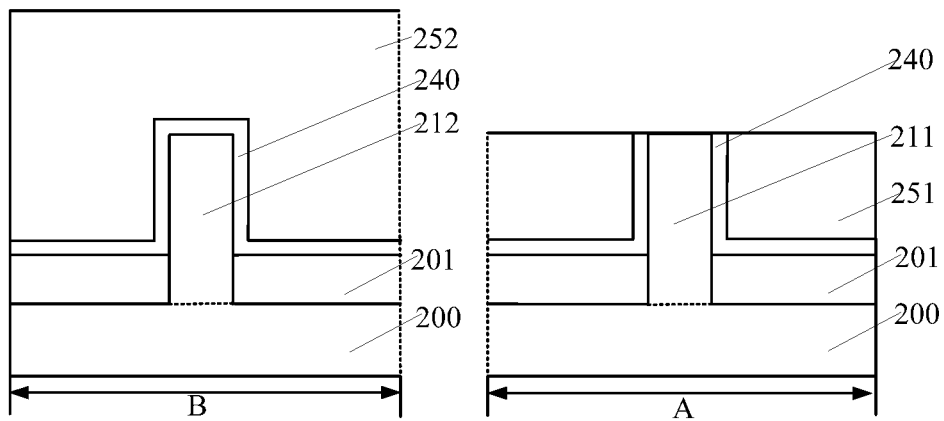

Further, returning to FIG. 20, a first PD dielectric layer may be formed on the isolation layer to cover the sidewall surfaces of the fin sidewall film in the PD region and also expose the top surfaces of the first replacement region of each first fin structure, and a PU dielectric layer may be formed on the isolation layer to cover the fin sidewall film of the PU region (S404). FIGS. 6-7 illustrate schematic cross-section views of a semiconductor structure consistent with some embodiments of the present disclosure. Specifically, FIG. 6 illustrates a schematic cross-section view processed from the cross-section view shown in FIG. 4, and FIG. 7 illustrates a schematic cross-section view processed from the cross-section view shown in FIG. 5.

Referring to FIGS. 6-7, a first PD dielectric layer 251 may be formed on the isolation layer 201. The first PD dielectric layer 251 may cover the sidewall surfaces of the fin sidewall film 240 and also expose the top surfaces of the first replacement region of each first fin structure 211.

The first PD dielectric layer 251 may be formed on the isolation layer 201 in the PD region A.

In one embodiment, during the formation of the first PD dielectric layer 251, the portion of the fin sidewall film 240 formed on the top surfaces of the first replacement region and on the top surface of each PD gate structure 221 may be removed such that the top surface of the first replacement region of each first fin structure 211 may be exposed.

The first PD dielectric layer 251 may be formed by a method including the following exemplary steps. An initial dielectric layer may be formed to cover the portion of the fin sidewall film 240 formed on the surface of the isolation layer 201 in the PD region A, the portion of the fin sidewall film 240 formed on the sidewall surfaces of each PD gate structure 221, and the portion of the fin sidewall film 240 formed on the top and the sidewall surfaces of the first replacement region. The initial dielectric layer may expose the portion of the fin sidewall film 240 formed on the top surface of each PD gate structure 221. The initial dielectric layer and the fin sidewall film 240 formed in the PD region A may be etched back until the top surface of the first replacement region of each first fin structure 211 is exposed. The portion of the fin sidewall film 240 formed on the top surface of each PD gate structure 221 may be simultaneously removed. As such, the remaining portion of the initial dielectric layer in the PD region A may become the first PD dielectric layer 251.

The process of etching back the portion of the fin sidewall film 240 and the initial dielectric layer formed in the PD region A may remove the portion of the fin sidewall film 240 formed on the top surface of each first gate protection layer 231 and also remove the portion of the fin sidewall film 240 formed on the top surface of the first replacement region.

The initial dielectric layer may be made of $SiO_x$, or a low-k dielectric material (for example, a material with a dielectric constant k smaller than 3.9).

In one embodiment, during the formation of the first PD dielectric layer 251, a first logic dielectric layer may be formed on the isolation layer 201 in the first logic region, and during the formation of the first logic dielectric layer, the portion of the fin sidewall film 240 formed on the top surface of the third replacement region may be removed to expose the top surface of the third replacement region.

For example, the initial dielectric layer may be formed in the first logic region to cover the portion of the fin sidewall film 240 formed on the surface of the isolation layer 201 in the first logic region, the portion of the fin sidewall film 240 formed on the sidewall surfaces of each first logic gate structure, and the portion of the fin sidewall film 240 formed on the top and the sidewall surfaces of the third replacement region. The initial dielectric layer formed in the first logic region may expose the portion of the fin sidewall film 240 formed on the top surface of each first logic gate structure. During the process of etching back the potion of the initial dielectric layer and the fin sidewall film 240 formed in the PD region A, the initial dielectric layer and the fin sidewall film 240 formed in the first logic region may also be etched back until the top surface of the third replacement region of each third fin structure is exposed. The portion of the fin sidewall film 240 formed on the top surface of each first logic gate structure may be simultaneously removed. As such, the remaining portion of the initial dielectric layer in the first logic region may become the first logic dielectric layer.

The process of etching back the portion of the fin sidewall film 240 and the initial dielectric layer formed in the first logic region may remove the portion of the fin sidewall film 240 formed on the top surface of each third gate protection layer and also remove the portion of the fin sidewall film 240 formed on the top surface of the third replacement region.

In other embodiments, the portion of the initial dielectric layer and the fin sidewall film 240 formed in the first logic region may not be etched back, and thus the initial dielectric layer formed in the first logic region may directly become the first logic dielectric layer. Alternatively, etching back the portion of the initial dielectric layer and the fin sidewall film formed in the PD region and etching back the portion of the initial dielectric layer and the fin sidewall film formed in the first logic region may be, instead of simultaneously process, processed separately.

In one embodiment, during the formation of the first PD dielectric layer 251, a PU dielectric layer may be formed on the isolation layer 201 in the PU region B, and the PU dielectric layer 252 may cover the fin sidewall film 240 of the PU region B.

For example, the initial dielectric layer may be formed in the PU region B to cover the portion of the fin sidewall film 240 formed on the surface of the isolation layer 201 in the PU region B, the portion of the fin sidewall film 240 formed on the sidewall surfaces of each PU gate structure 222, and the portion of the fin sidewall film 240 formed on the top and the sidewall surfaces of the second replacement region. The initial dielectric layer formed in the PU region B may expose the portion of the fin sidewall film 240 formed on the top surface of each PU gate structure 222. The initial dielectric layer in the PU region B may form the PU dielectric layer 252.

In one embodiment, the initial dielectric layer may also be formed in the second logic region to cover the portion of the fin sidewall film 240 formed on the surface of the isolation layer 201 in the second logic region, the portion of the fin sidewall film 240 formed on the sidewall surfaces of each second logic gate structure, and the portion of the fin sidewall film 240 formed on the top and the sidewall surfaces of the fourth replacement region. The initial dielectric layer formed in the second logic region may expose the portion of the fin sidewall film 240 formed on the top surface of each second logic gate structure.

In one embodiment, after forming the initial dielectric layer and prior to etching back the portion of the initial dielectric layer and the fin sidewall film 240 formed in the PD region A, the portion of the initial dielectric layer and the fin sidewall film 240 formed in the second logic region may be etched back until the top surface of the fourth replacement region of each fourth fin structure is exposed. The portion of the fin sidewall film 240 formed on the top surface of each second logic gate structure may be simultaneously removed. As such, the remaining portion of the initial dielectric layer in the second logic region may become the second logic dielectric layer. Moreover, the fourth replacement region of each fourth fin structure and the portion of the fin sidewall film 240 formed on the sidewall surfaces of the fourth replacement region may be removed to form a fourth trench. A fourth source/drain doped layer may be formed in the fourth trench. A second logic cover layer may be formed on the surface of the fourth source/drain doped layer. After forming the second logic cover layer, the portion of initial dielectric layer and the fin sidewall film 240 formed in the PD region A may then be etched back.

The process of forming the fourth trench by removing the portion of the fin sidewall film 240 formed on the fourth replacement region of each fourth fin structure and the sidewall surfaces of the fourth replacement region may include the following exemplary steps. A fourth initial trench may be formed by removing the fourth replacement region of the fourth fin structure. The fourth trench may be formed by further removing the portion of the fin sidewall film 240 on the sidewall surfaces of the fourth initial trench.

The fourth source/drain doped layer may be formed by an epitaxial growth process. The fourth source/drain doped layer may be made of SiGe doped with fourth source/drain doping ions. The fourth source/drain doping ions may be P-type ions. The fourth source/drain doped layer may be formed in the fourth fin structure on both sides of each second logic gate structure. The second logic cover layer may be made of SiN, SiCN, SiBN, or SiON.

In other embodiments, the portion of the initial dielectric layer and the fin sidewall film 240 formed in the second logic region may not be etched back, and thus the initial dielectric layer formed in the second logic region may directly become the second logic dielectric layer.

Figure 8:
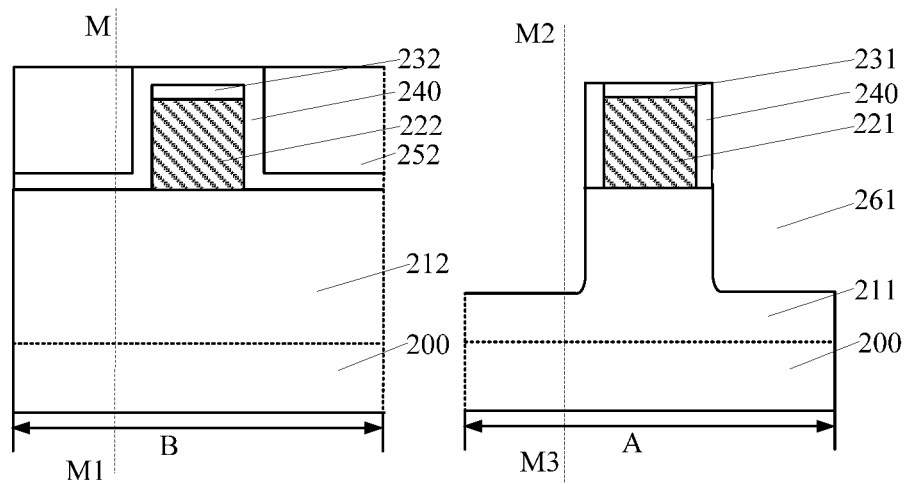
Figure 9:
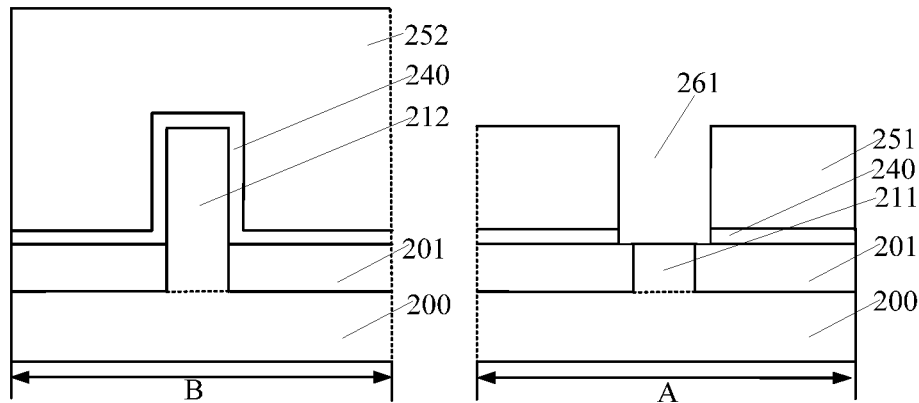

Further, returning to FIG. 20, after forming the first PD dielectric layer, the first replacement region of each first fin structure and the portion of the fin sidewall film formed on the sidewall surfaces of the first replacement region may be removed to form a first trench (S405). FIGS. 8-9 illustrate schematic cross-section views of a semiconductor structure consistent with some embodiments of the present disclosure. Specifically, FIG. 8 illustrates a schematic cross-section view processed from the cross-section view shown in FIG. 6, and FIG. 9 illustrates a schematic cross-section view processed from the cross-section view shown in FIG. 7.

Referring to FIGS. 8-9, after forming the first PD dielectric layer 251, the first replacement region of each first fin structure 211 and the portion of the fin sidewall film 240 formed on the sidewall surfaces of the first replacement region may be removed to form a first trench 261.

The first replacement region of each first fin structure 211 and the portion of the fin sidewall film 240 formed on the sidewall surfaces of the first replacement region may be removed by a process including the following exemplary steps. The first replacement region of each first fin structure 211 may be removed to form a first initial trench. The portion of the fin sidewall film 240 on the sidewall surfaces of the first initial trench may be removed to form the first trench 261. For example, the process for removing the first replacement region of each first fin structure 211 may include a dry etching process, and the process for removing the portion of the fin sidewall film 240 on the sidewall surfaces of the first initial trench may be a dry etching process, a wet etching process, or a process combining the dry etching and the wet etching. In one embodiment, the portion of the fin sidewall film 240 on the sidewall surfaces of the first initial trench is removed by a wet etching process. The process parameters of the wet etching process may include using a phosphoric acid solution as the etching solution.

In one embodiment, during the process of removing the first replacement region of each first fin structure 211 and the portion of the fin sidewall film 240 on the sidewall surfaces of the first replacement region, the third replacement region of each third fin structure and the portion of the fin sidewall film 240 on the sidewall surfaces of the third replacement region may also be removed to form a third trench. For example, when removing the first replacement region of each first fin structure 211, the third replacement region of each third fin structure may also be removed to form a third initial trench. When removing the portion of the fin sidewall film 240 on the sidewall surfaces of the first initial trench, the portion of the fin sidewall film 240 on the sidewall surfaces of the third initial trench may also be removed to form the third trench. As such, the fabrication process may be simplified.

In other embodiments, the third trench may not be formed.

Figure 10:
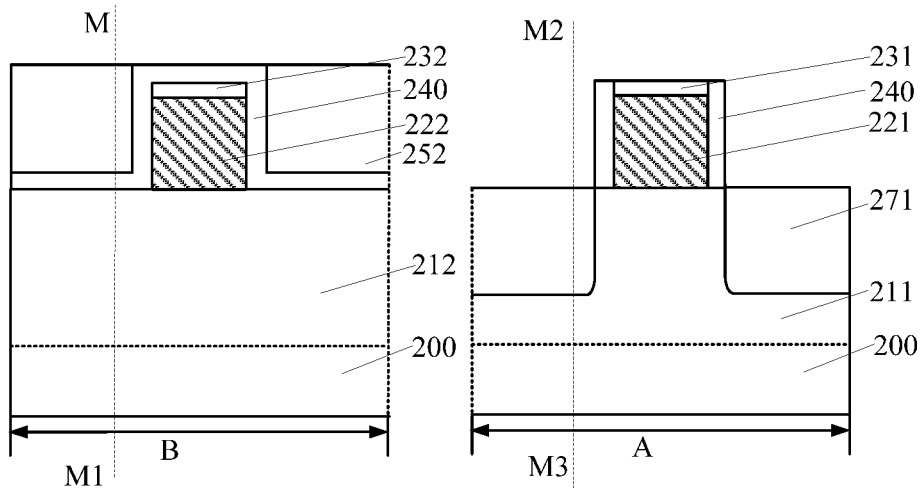
Figure 11:
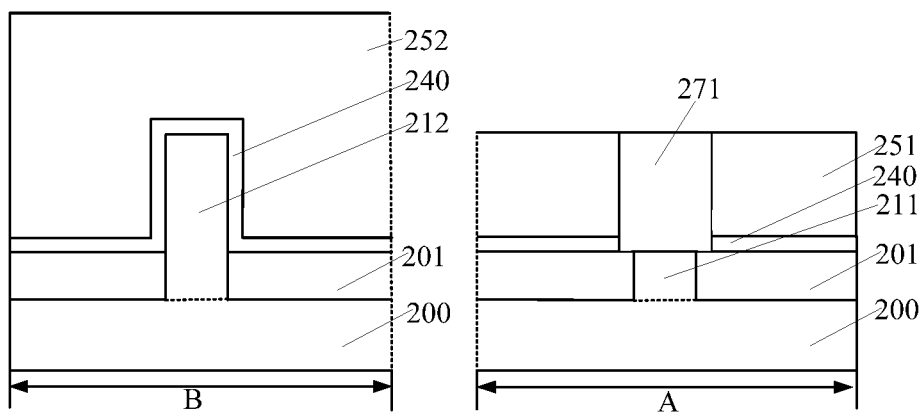

Further, returning to FIG. 20, a first source/drain doped layer may be formed in the first trench (S406). FIGS. 10-11 illustrate schematic cross-section views of a semiconductor structure consistent with some embodiments of the present disclosure. Specifically, FIG. 10 illustrates a schematic cross-section view processed from the cross-section view shown in FIG. 8, and FIG. 11 illustrates a schematic cross-section view processed from the cross-section view shown in FIG. 9.

Referring to FIGS. 10-11, a first source/drain doped layer 271 may be formed in the first trench 261 (referring to FIGS. 8-9).

The first source/drain doped layer 271 may be formed by an epitaxial growth process. After forming the first source/drain doped layer 271, the formed first source/drain doped layer 271 may be located in the first fin structure 211 on both sides of each PD gate structure 221. The first source/drain doped layer 271 may be made of silicon doped with first source/drain doping ions. The first source/drain doping ions may be N-type ions.

In one embodiment, when forming the first source/drain doped layer 271 in the first trench 261, a third source/drain doped layer (not shown) may be formed in the third trench (not shown). As such, the fabrication process may be simplified. The third source/drain doped layer may be made of a same material as the first source/drain doped layer 271 is made. The third source/drain doped layer may be located in the third fin structure on both sides of each first logic gate structure. In other embodiments, the first source/drain doped layer and the third source/drain doped layer may be formed separately by different processes.

Figure 12:
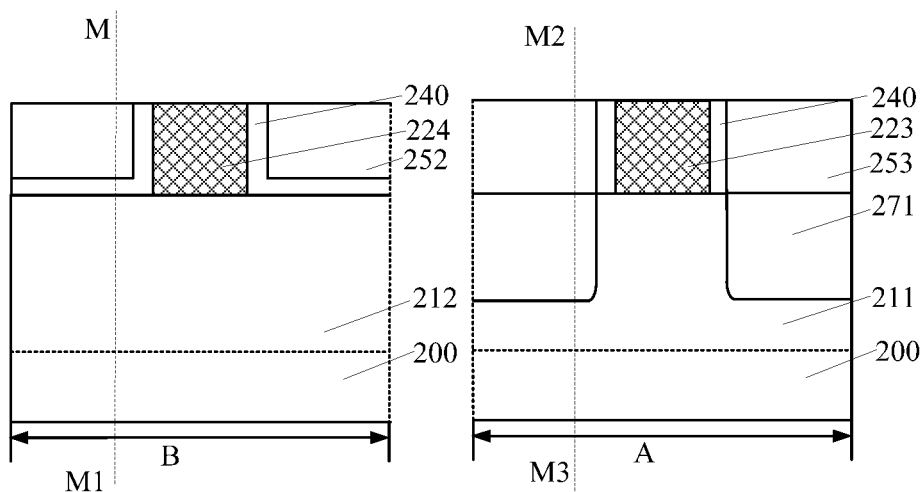
Figure 13:
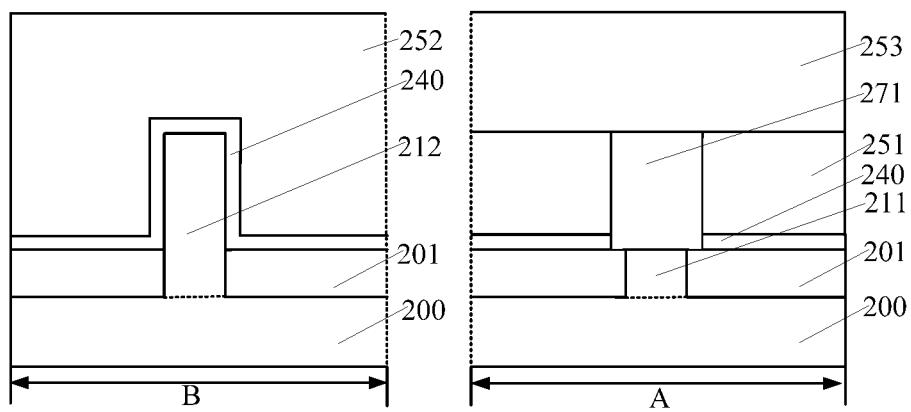

Further, returning to FIG. 20, a second PD dielectric layer may be formed on the first source/drain doped layer and the first PD dielectric layer, the PD gate structure may then be removed to form a PD gate opening and a PD metal gate structure may be formed in the PD gate opening, the PU gate structure may also be removed to form a PU opening and a PU metal gate structure may be formed in the PU gate opening (S407). FIGS. 12-13 illustrate schematic cross-section views of a semiconductor structure consistent with some embodiments of the present disclosure. Specifically, FIG. 12 illustrates a schematic cross-section view processed from the cross-section view shown in FIG. 10, and FIG. 13 illustrates a schematic cross-section view processed from the cross-section view shown in FIG. 11.

Referring to FIGS. 12-13, a second PD dielectric layer 253 may be formed on the first source/drain doped layer 271 and the first PD dielectric layer 251. After forming the second PD dielectric layer 253, the PD gate structure 221 may be removed to form a PD gate opening (not shown), and then a PD metal gate structure 223 may be formed in the PD gate opening. Moreover, after forming the second PD dielectric layer 253, the PU gate structure 222 may also be removed to form a PU opening, and then a PU metal gate structure 224 may be formed in the PU gate opening.

In one embodiment, a third logic dielectric layer may be formed on the third source/drain doped layer and the first logic source/drain dielectric layer. The third logic dielectric layer together with the first logic dielectric layer may form a first logic dielectric structure. Similarly, a fourth logic dielectric layer may be formed on the fourth source/drain doped layer and the second logic source/drain dielectric layer. The fourth logic dielectric layer may also cover the second logic cover layer. The fourth logic dielectric layer together with the second logic dielectric layer may form a second logic dielectric structure. In one embodiment, when forming the second PD dielectric layer 253, a third logic dielectric layer and a fourth logic dielectric layer may be formed.

In one embodiment, when forming the second PD dielectric layer 253, the third logic dielectric layer, and the fourth logic dielectric layer, the portion of the first gate protection layer 231 formed on the top surface of each PD gate structure 221, the third gate protection layer formed on the top surface of the first logic gate structure, the fourth protection layer formed on the top surface of each logic gate structure, and the portion of the fin sidewall film 240 and the second gate protection layer 232 formed on the top surface of the PU gate structure 222 may be removed. Therefore, the top surface of each PD gate structure 221, the top surface of each PU gate structure 222, the top surface of each first logic gate structure, and the top surface of each second logic gate structure may be exposed. Further, the PD gate structure 221, the PU gate structure 222, the first logic gate structure, and the second logic gate structure may be removed to form a PD gate opening, a PU gate opening, a first logic gate opening, and a second logic gate opening, respectively. A PD metal gate structure 223 may be formed in the PD gate opening, a PU metal gate structure 224 may be formed in the PU gate opening, a first logic metal gate structure may be formed in the first logic gate opening, and a second logic metal gate structure may be formed in the second logic gate opening.

The first source/drain doped layer 271 may be located in the first fin structure 211 on both sides of each PD metal gate structure 223, the third source/drain doped layer may be located in the third fin structure on both sides of each first logic metal gate structure, and the fourth source/drain doped layer may be located in the fourth fin structure on both sides of each second logic metal gate structure.

Figure 14:
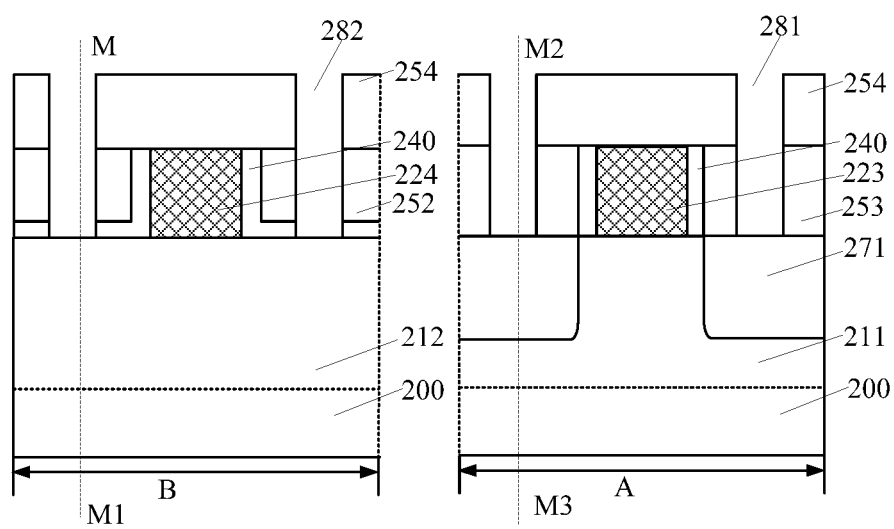
Figure 15:
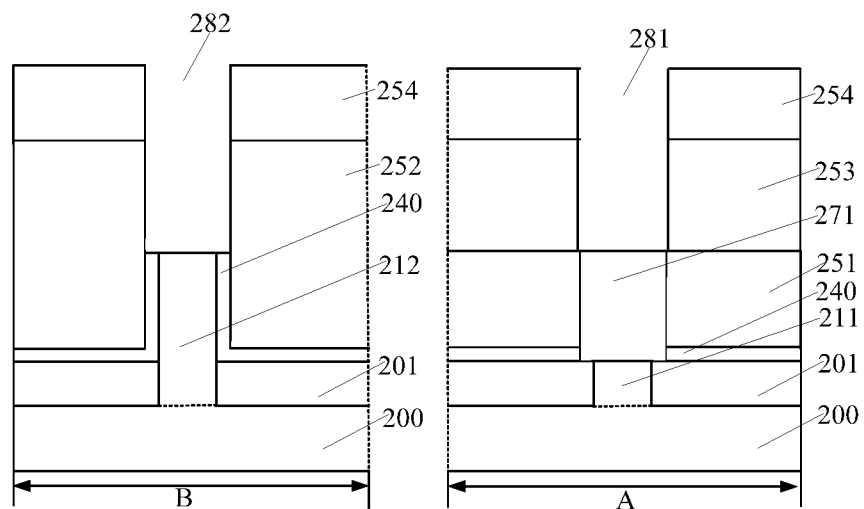

Further, returning to FIG. 20, a top dielectric layer may be formed on the PD region and the PU region; a plurality of PD trenches may be formed through the second PD dielectric layer and the top dielectric layer to expose the top surface of the first source/drain doped layer; and a plurality of PU trenches may be formed through the PU dielectric layer and the top dielectric layer to expose the top surface of each second fin structure (S408). FIGS. 14-15 illustrate schematic cross-section views of a semiconductor structure consistent with some embodiments of the present disclosure. Specifically, FIG. 14 illustrates a schematic cross-section view processed from the cross-section view shown in FIG. 12, and FIG. 15 illustrates a schematic cross-section view processed from the cross-section view shown in FIG. 13.

Referring to FIGS. 14-15, a top dielectric layer 254 may be formed on the second PD dielectric layer 253, the PU dielectric layer 252, the first logic dielectric structure, the second logic dielectric structure, the PD metal gate structure 223, the PU metal gate structure 224, the first logic metal gate structure, and the second logic metal gate structure. Further, a plurality of PD trenches 281 may be formed through the second PD dielectric layer 253 and the top dielectric layer 254 to expose the top surface of the first source/drain doped layer 271; and a plurality of PU trenches 282 may be formed through the PU dielectric layer 252 and the top dielectric layer 254 to expose the top surface of each second fin structure 212.

The top dielectric layer 254 may be made of $SiO_x$ or a low-k dielectric material. The top dielectric layer 254 may be formed by a deposition process, such as high-density plasma CVD, etc.

In one embodiment, a plurality of first logic trenches may be formed through the first logic dielectric structure and the top dielectric layer 254 to expose the top surface of the third source/drain doped layer, and a plurality of second logic trenches may be formed through the second logic dielectric structure and the top dielectric layer 254 to expose the top surface of the fourth source/drain doped layer.

In one embodiment, the PU trench 282, the PD trench 281, the first logic trench, and the second logic trench may be formed by a single etching process such that the fabrication process may be simplified. In other embodiments, the PU trench, the PD trench, the first logic trench, and the second logic trench may be formed by different etching processes. Alternatively, the PD trench and the first logic trench may be simultaneously formed by an etching process, and the PU trench and the second logic trench may be simultaneously formed by another etching process.

In one embodiment, after forming the top dielectric layer 254, an annealing process may be performed to improve the material density of the top dielectric layer 254, the second PD dielectric layer 253, the PU dielectric layer 252, the first logic dielectric structure, and the second logic dielectric structure. In addition, by performing the annealing process after forming the top dielectric layer 254, the stress in the top dielectric layer 254, the second PD dielectric layer 253, the PU dielectric layer 252, the first logic dielectric structure, and the second logic dielectric structure may be released.

Figure 16:
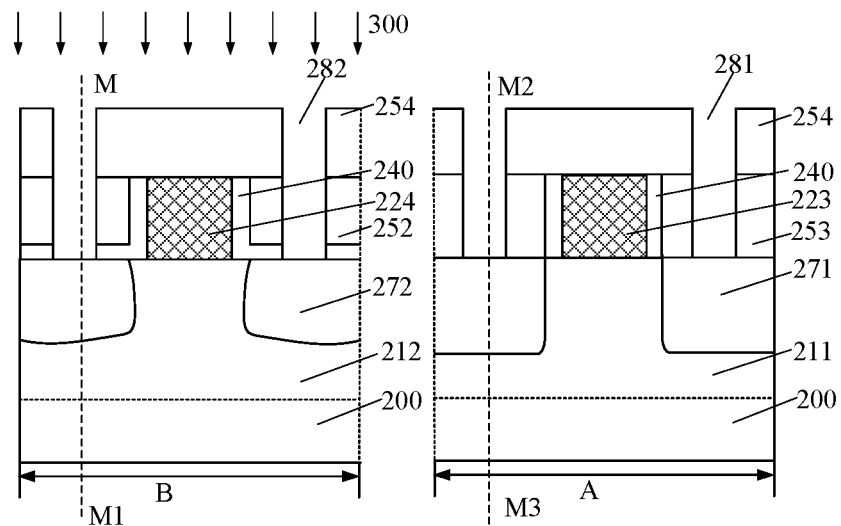
Figure 17:
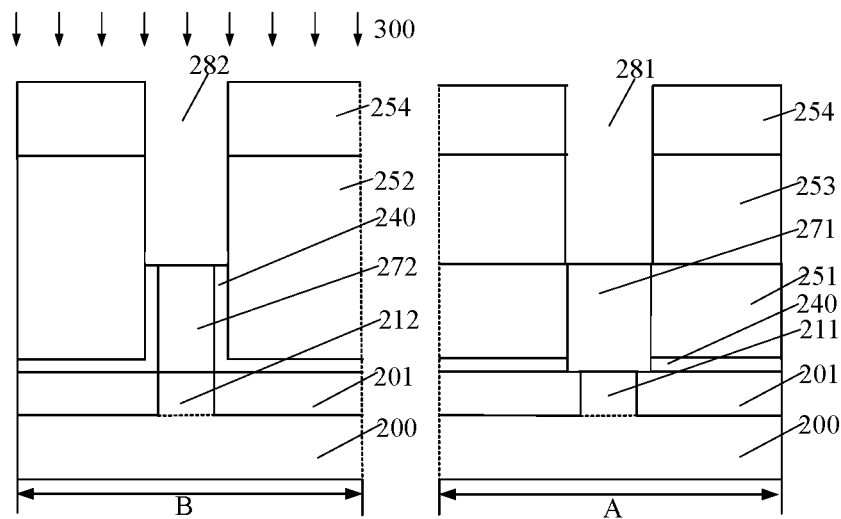

Further, returning to FIG. 20, an ion implantation process may be performed on the portion of each second fin structure exposed in the PU trench to form a second source/drain doped layer next to the first source/drain doped layer (S409). FIGS. 16-17 illustrate schematic cross-section views of a semiconductor structure consistent with some embodiments of the present disclosure. Specifically, FIG. 16 illustrates a schematic cross-section view processed from the cross-section view shown in FIG. 14, and FIG. 17 illustrates a schematic cross-section view processed from the cross-section view shown in FIG. 15.

Referring to FIGS. 16-17, an ion implantation process 300 may be performed on the portion of each second fin structure 212 exposed in the PU trench 282 to form a second source/drain doped layer 272. The second source/drain doped layer 272 may be adjacent to the first source/drain doped layer 271.

After forming the second source/drain doped layer 272, the formed second source/drain doped layer 272 may be located in the second fin structure 212 on both sides of each PU metal gate structure 224. The implantation ions used in the ion implantation process 300 may be second source/drain doping ions. The second source/drain doping ions may be P-type ions.

In one embodiment, because the PU trench 282 and the PD trench 281 are formed in a same etching process, the first source/drain doped layer 271 may be exposed in the environment of the ion implantation process. Therefore, the second source/drain doping ions may also be implanted into the first source/drain doped layer 271. In order to ensure that the first source/drain doped layer 271 remains the N-type, the concentration of the second source/drain doping ions in the formed second source/drain doped layer 272 may be lower than the concentration of the first source/drain doping ions in the first source/drain doped layer 271. In one embodiment, because the PU trench 282 and the first logic trench are formed in a same etching process, the third source/drain doped layer may be exposed in the environment of the ion implantation process. Therefore, the second source/drain doping ions may also be implanted into the third source/drain doped layer. In order to ensure that the third source/drain doped layer remains the N-type, the concentration of the second source/drain doping ions in the formed second source/drain doped layer 272 may be lower than the concentration of the third source/drain doping ions in the third source/drain doped layer.

In other embodiments, the PU trench may be formed first and then the ion implantation process 300 may be performed to form the PD trench and the first logic trench. As such, implanting the second source/drain doping ions into the first source/drain doped layer and the third source/drain doped layer may be avoided. Therefore, the concentration of the second source/drain doping ions in the formed second source/drain doped layer may not need to be limited into any specific range as compared to the concentration of the first source/drain doping ions in the first source/drain doped layer or compared to the concentration of the third source/drain doping ions in the third source/drain doped layer.

Figure 18:
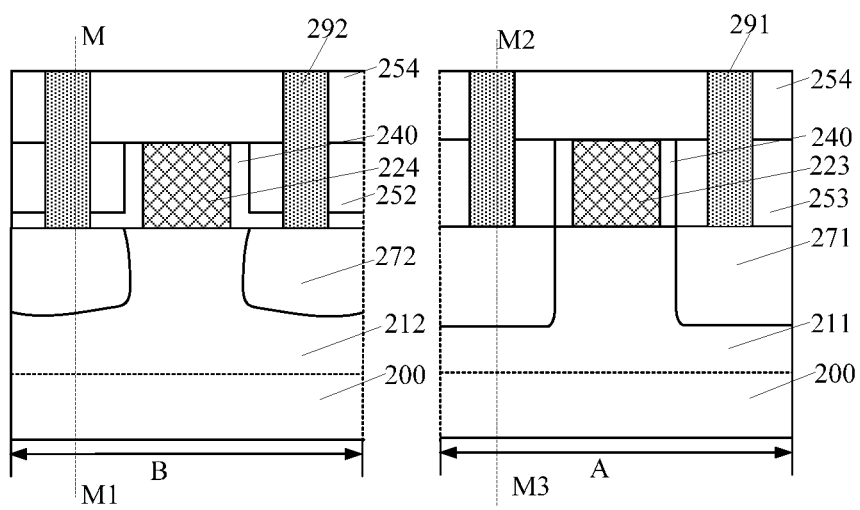
Figure 19:
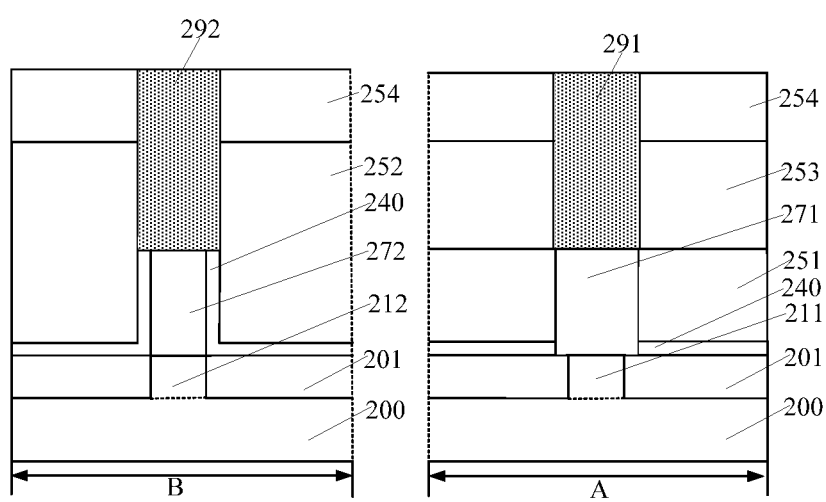

Further, returning to FIG. 20, a PD plug may be formed in each PD trench, and a PU plug may be formed in each PU trench (S410). FIGS. 18-19 illustrate schematic cross-section views of a semiconductor structure consistent with some embodiments of the present disclosure. Specifically, FIG. 18 illustrates a schematic cross-section view processed from the cross-section view shown in FIG. 16, and FIG. 19 illustrates a schematic cross-section view processed from the cross-section view shown in FIG. 17.

Referring to FIGS. 18-19, a PD plug 291 may be formed in each PD trench 281 (referring to FIGS. 16-17), and after forming the second source/drain doped layer 272, a PU plug 292 may be formed in each PU trench 282 (referring to FIGS. 16-17).

In one embodiment, a first logic plug may be formed in each first logic trench, and a second logic plug may be formed in each second logic trench. The PD plug 291, the PU plug 292, the first logic plug, and the second logic plug may be made of a metal, such as W. In one embodiment, the PU plug 292, the PD plug 291, the first logic plug, and the second logic plug may be formed after performing the ion implantation process.

The present disclosure also provides an SRAM fabricated according to the method described above. FIGS. 18-19 illustrate schematic cross-section views of an exemplary SRAM consistent with some embodiments of the present disclosure. FIG. 18 illustrates schematic cross-section views of the SRAM in the length direction of a first fin structure in region A, and in the length direction of a second fin structure in region B, respectively. FIG. 19 illustrates schematic cross-section views of the SRAM along an M-M1 line (shown in FIG. 18), and along an M2-M3 line (shown in FIG. 18), respectively.

Referring to FIGS. 18-19, the SRAM may include a semiconductor substrate 200. The semiconductor substrate 200 may include a PD region A and a PU region B. The SRAM may include a plurality of first fin structures 211 formed on the PD region A of the semiconductor substrate 200, and a plurality of second fin structures 212 formed on the PU region B of the semiconductor substrate. As shown in FIG. 18 and FIG. 19, only one first fin structure 211 and one second fin structure 212 are provided as examples for further illustration of the structure of the SRAM.

In one embodiment, each first fin structure 211 may be adjacent to a second fin structure 212. An isolation layer 201 may be formed on the semiconductor substrate 200 to cover a portion of the sidewall surfaces of each first fin structure 211 as well as a portion of the sidewall surfaces of each second fin structure 212.

The SRAM may include a PD transistor formed on each first fin structure 211. The PD transistor may include a PD gate structure formed across the first fin structure 211. In one embodiment, the PD gate structure may be a PD metal gate structure 223.

The SRAM may include an adjacent transistor formed on each second fin structure 212. In one embodiment, the adjacent transistor may be a PU transistor. The PU transistor may include a PU gate structure formed across the second fin structure 212. In one embodiment, the PU gate structure may be a PU metal gate structure 224.

The SRAM may include a fin sidewall film 240 formed on the sidewall surfaces of the PD metal gate structure 223. In one embodiment, the fin sidewall film 240 may also be formed on the sidewall surfaces of the PU metal gate structure 224. The thickness of the fin sidewall film 240 may be in a range of approximately 3 nm to 10 nm.

The SRAM may include a first source/drain doped layer 271 formed in the first fin structure 211 on both sides of each PD metal gate structure 223, and a second source/drain doped layer 272 formed in the second fin structure 212 on both sides of each PU metal gate structure 224.

The SRAM may include a first PD dielectric layer 251 formed on the isolation layer 201 of the PD region A. Along the width direction of the first fin structure 211 (i.e., the direction perpendicular to the length direction of the first fin structure 211), the first PD dielectric layer 251 may be located on both sides of the first source/drain doped layer 271. During the fabrication of the SRAM, the first source/drain doped layer 271 may be fabricated after forming the first PD dielectric layer 251. Therefore, the width of the first source/drain doped layer 271 along the width direction of the first fin structure 211 may be defined by a trench formed in the first PD dielectric layer 251. As such, the first PD dielectric layer 251 may limit the growth space of the first fin source/drain doped layer 271 during the epitaxial growth process such that the first source/drain doped layer may not protrude outward along the width direction of the first fin structure 211. Therefore, the edges of the first source/drain doped layer 271 may be prevented from being connected to the adjacent second source/drain doped layer 272, and thus bridging connection between the voltage applied on the first source/drain doped layer 271 and the voltage applied on the second source/drain doped layer 272 may be avoided. Therefore, the performance of the SRAM may be improved.

The present disclosure also provides another method for fabricating SRAMs. As compared to the method described above, in which the second source/drain doped layer is formed by an ion implantation process, the method for fabricating SRAMs may not use an ion implantation process to fabricate the second source/drain doped layer. Instead, the method may adopt a fabrication process similar to the fabrication process for forming the first source/drain doped layer, according to the method described above, to form the second source/drain doped layer.

For example, after forming the first source/drain doped layer, a PD cover layer may be formed to cover the first source/drain doped layer. Moreover, forming the plurality of PU transistors may include the following exemplary steps. When forming the first PD dielectric layer, a PU initial dielectric layer may be formed on the isolation layer of the PU region to cover the fin sidewall film of the PU region. After forming the PD cover layer, the PU initial dielectric layer and the fin sidewall film formed in the PU region may be etched back until the top surface of the second replacement region of each second fin structure is exposed. The portion of the fin sidewall film formed on the top surface of each PU gate structure may be simultaneously removed. As such, the remaining portion of the PU initial dielectric layer in the PU region may become the first PU dielectric layer. After etching back the PU initial dielectric layer and the fin sidewall film formed in the PU region, the second replacement region of each second fin structure and the portion of the fin sidewall film formed on the sidewall surfaces of the second replacement region may be removed to form a second trench. Further, a second source/drain doped layer may be formed in the second trench. A second PU dielectric layer may then be formed on the second source/drain doped layer and the first PU dielectric layer. The second PU dielectric layer and the first PU dielectric layer may together form a PU dielectric layer.

The PD cover layer may be made of SiN, SiCN, SiBN, or SiON. In one embodiment, the second source/drain doped layer may be made of SiGe doped with second source/drain doping ions. The second source/drain doping ions may be P-type ions. The second source/drain doped layer may be formed by an epitaxial growth process.

In one embodiment, the PD cover layer may also cover the third source/drain doped layer.

In one embodiment, a second PD dielectric layer may be formed on the first source/drain doped layer and the second PD dielectric layer. Moreover, a third logic dielectric layer may be formed on the third source/drain doped layer and the first logic dielectric layer. The third logic dielectric layer may also cover the portion of the PD cover layer formed on the third source/drain doped layer. The third logic dielectric layer and the first logic dielectric layer may together form a first logic dielectric structure. A fourth logic dielectric layer may be formed on the fourth source/drain doped layer and the second logic dielectric layer. The fourth logic dielectric layer may also cover the second logic cover layer. The fourth logic dielectric layer and the second logic dielectric layer may together form a second logic dielectric structure.

In one embodiment, when forming the second PD dielectric layer, a third logic dielectric layer, a fourth logic dielectric layer, and a second PU dielectric layer may also be formed.

In one embodiment, when forming the second PD dielectric layer, the third logic dielectric layer, the fourth logic dielectric layer, and the second PU dielectric layer, a first gate protection layer formed on the top surface of each PD gate structure, the portion of the third gate protection layer formed on the top surface of each first logic gate structure, the portion of the fourth protection layer formed on the top surface of each second logic gate structure, and the portion of the second gate protection layer formed on the top surface of each PU gate structure may be removed to expose the top surfaces of each PD gate structure, each PU gate structure, each first logic gate structure, and each second logic gate structure. Further, each PD gate structure, each PU gate structure, each first logic gate structure, and each second logic gate structure may be removed to form a PD gate opening, a PU gate opening, a first logic gate opening, and a second logic gate opening, respectively. Moreover, a PD metal gate structure may be formed in the PD gate opening, a PU metal gate structure may be formed in the PU gate opening, a first logic metal gate structure may be formed in the first logic gate opening, and a second logic metal gate structure may be formed in the second logic gate opening.

In one embodiment, a top dielectric layer may be formed on the second PD dielectric layer, the PU dielectric layer, the first logic dielectric structure, and the second logic dielectric structure. A plurality of PD trenches may be form through the second PD dielectric layer and the top dielectric layer to expose the top surface of the first source/drain doped layer, and a plurality of PU trenches may be form through the PU dielectric layer and the top dielectric layer to expose the top surface of the second source/drain doped layer.

In one embodiment, a plurality of first logic trenches may be form through the first logic dielectric layer and the top dielectric layer to expose the top surface of the third source/drain doped layer, and a plurality of second logic trenches may be form through the second logic dielectric layer and the top dielectric layer to expose the top surface of the fourth source/drain doped layer. Moreover, a PU plug may be formed in each PU trench, a PD plug may be formed in each PD trench, a first logic plug may be formed in each first logic trench, and a second logic plug may be formed in each second logic trench.

The present disclosure also provides another SRAM, which may further include a second PD dielectric layer formed on the isolation layer of the PU region. Along the width direction of the second fin structure (i.e., the direction perpendicular to the length direction of the second fin structure), the second PD dielectric layer may be located on both sides of the second source/drain doped layer. Because the second source/drain doped layer may be fabricated after forming the second PD dielectric layer during the fabrication process of the SRAM. Therefore, the width of the second source/drain doped layer along the width direction of the second fin structure may be defined by a trench formed in the second PD dielectric layer. As such, the second PD dielectric layer may limit the growth space of the second fin source/drain doped layer during the epitaxial growth process such that the second source/drain doped layer may not protrude outward along the width direction of the second fin structure. Therefore, the edges of the second source/drain doped layer may be prevented from being connected to the adjacent first source/drain doped layer, and thus bridging connection between the voltage applied on the second source/drain doped layer and the voltage applied on the first source/drain doped layer may be avoided. Therefore, the performance of the SRAM may be further improved.

Compared to conventional SRAMs and fabrication methods, the disclosed SRAMs and fabrication methods may demonstrate the following advantages.

According to the disclosed SRAMs and fabricating methods, the first trench is formed by removing the first replacement region of the first fin structure and the portion of the fin sidewall film formed on the sidewall surfaces of the first replacement region. The first source/drain doped layer is then formed in the first trench. Therefore, the dimension of the first source/drain doped layer along the width direction of the first fin structure is greater than the width of the first replacement region. As such, the top surface of the first source/drain doped layer may be large, and thus the contact resistance between the first source/drain doped layer and the subsequently-formed PD plug may be reduced.

Moreover, during the formation process of the first source/drain doped layer, the first PD dielectric layer limits the growth space of the first fin source/drain doped layer such that the first source/drain doped layer may not protrude outward along the width direction of the first fin structure. Therefore, the edges of the first source/drain doped layer may be prevented from being connected to the adjacent second source/drain doped layer, and thus bridging connection between the voltage applied on the first source/drain doped layer and the voltage applied on the second source/drain doped layer may be avoided. Therefore, the performance of the SRAM may be improved.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for fabricating a static random access memory (SRAM), comprising:

providing a semiconductor substrate;

forming a plurality of first fin structures, a plurality of second fin structures, and an isolation layer on the semiconductor substrate, wherein each first fin structure is adjacent to a second fin structure, the isolation layer covers a portion of sidewall surfaces of each first fin structure, and a portion of each first fin structure exposed by the isolation layer includes a first replacement region;

forming a plurality of pull down (PD) transistors, including:

forming a plurality of PD gate structures across the plurality of first fin structures, wherein each PD gate structure covers a portion of a top and sidewall surfaces of a first fin structure, and the first replacement region is located on both sides of each PD gate structure;

forming a fin sidewall film on sidewall surfaces of the first replacement region of each first fin structure and on a top surface of the isolation layer;

forming a first PD dielectric layer on the isolation layer to cover sidewall surfaces of the fin sidewall film and expose a top surface of the first replacement region of each first fin structure;

removing the first replacement region of each first fin structure and a portion of the fin sidewall film formed on sidewall surfaces of the first replacement region to form a first trench; and forming a first source/drain doped layer in the first trench; and forming a plurality of adjacent transistors, wherein the plurality of adjacent transistors are a plurality of pull-up (PU) transistors, including:

forming a second source/drain doped layer in the plurality of second fin structures, wherein the second source/drain doped layer is adjacent to the first source/drain doped layer, wherein:

the semiconductor substrate includes a PD region and a PU region;

the plurality of first fin structures are formed on the PD region of the semiconductor substrate;

the plurality of second fin structures are formed on the PU region of the semiconductor substrate;

the isolation layer is formed on the PD region and the PU region of the semiconductor substrate and covers a portion of a top and sidewall surfaces of each second fin structure;

the first PD dielectric layer is formed on the PD region of the semiconductor substrate;

prior to forming the first PD dielectric layer, the fin sidewall film is formed on the top surface of the first replacement region of each first fin structure, the top surface of the isolation layer in the PD region and the PU region, and the top and sidewall surfaces of each second fin structure;

forming the plurality of PD transistors also includes, when forming the first PD dielectric layer, removing a portion of the fin sidewall film formed on the top surface of the first replacement region of each first fin structure to expose the top surface of the first replacement region;

when forming the first PD dielectric layer, forming a PU dielectric layer on the isolation layer of the PU region to cover a portion of the fin sidewall film formed in the PU region;

after forming the first source/drain doped layer, forming a plurality of PU trenches in the PU dielectric layer to expose the top surface of each second fin structure;

performing an ion implantation process to form a second source/drain doped layer in the second fin structure exposed by the plurality of PU trenches; and forming a PU plug in each PU trench.

2. The method according to claim 1, wherein forming the plurality of PD transistors further includes:

forming a second PD dielectric layer on the first source/drain doped layer and the first PD dielectric layer;

forming a plurality of PD trenches through the second PD dielectric layer to expose a portion of a top surface of the first source/drain doped layer; and form a PD plug in each PD trench.

3. The method according to claim 1, wherein:

the plurality of adjacent transistors are a plurality of pull-up (PU) transistors.

4. The method according to claim 3, wherein:

the plurality of PD transistors are N-type; and the plurality of PU transistors are P-type.

5. The method according to claim 4, wherein:

the first source/drain doped layer is made of silicon, and doped with first source/drain doping ions, wherein the first source/drain doping ions are N-type.

6. The method according to claim 3, wherein:

the semiconductor substrate includes a PD region and a PU region;

the plurality of first fin structures are formed on the PD region of the semiconductor substrate;

the plurality of second fin structures are formed on the PU region of the semiconductor substrate;

the isolation layer is formed on the PD region and the PU region of the semiconductor substrate and covers a portion of a top and sidewall surfaces of each second fin structure;

the first PD dielectric layer is formed on the PD region of the semiconductor substrate;

prior to forming the first PD dielectric layer, the fin sidewall film is formed on the top surface of the first replacement region of each first fin structure, the top surface of the isolation layer in the PD region and the PU region, and the top and sidewall surfaces of each second fin structure; and forming the plurality of PD transistors also includes, when forming the first PD dielectric layer, removing a portion of the fin sidewall film formed on the top surface of the first replacement region of each first fin structure to expose the top surface of the first replacement region.

7. The method according to claim 6, wherein a portion of each second fin structure exposed by the isolation layer includes a second replacement region, prior to forming the first PD dielectric layer, the fin sidewall film covers a top and sidewall surfaces of the second replacement region of each second fin structure, and the method further includes:

after forming the first source/drain doped layer, forming a PD cover layer to cover the first source/drain doped layer;

forming the plurality of PU transistors also includes:

prior to forming the fin sidewall film, forming a plurality of PU gate structures across the plurality of second fin structures, wherein each PU gate structure covers a portion of a top and sidewall surfaces of a second fin structure, and the second replacement region is located on both sides of each PU gate structure;

when forming the first PD dielectric layer, forming a PU initial dielectric layer on the isolation layer in the PU region to cover a portion of the fin sidewall film formed in the PU region;

after forming the PD cover layer, etching back the PU initial dielectric layer formed in the PU region and the portion of the fin sidewall film formed in the PU region until a top surface of the second replacement region of each second fin structure is exposed, a remaining portion of the PU initial dielectric layer forming a PU dielectric layer;

removing the second replacement region of each second fin structure and a portion of the fin sidewall film on sidewall surfaces of the second replacement region to form a second trench;

forming a second source/drain doped layer in the second trench;

forming a second PU dielectric layer on the second source/drain doped layer and the first PU dielectric layer, the second PU dielectric layer and the first PU dielectric layer together forming a PU dielectric layer;

forming a plurality of PU trenches in the PU dielectric layer to expose a top surface of the second source/drain doped layer; and forming a PU plug in each PU trench.

8. The method according to claim 6, wherein the semiconductor substrate further includes a first logic region, including a plurality of third fin structures, and used to form a plurality of transistors having a same type as the plurality of PD transistors; the isolation layer is also formed on the first logic region of the semiconductor substrate and covers a portion of a top and sidewall surfaces of each third fin structure, wherein a portion of each third fin structure exposed by the isolation layer includes a third replacement region; prior to forming the first PD dielectric layer, the fin sidewall film covers a top and sidewall surfaces of the third replacement region of each third fin structure, and the method further includes:

prior to forming the fin sidewall film, forming a plurality of first logic gate structures across the plurality of third fin structures, wherein each first logic gate structure covers a portion of a top and sidewall surfaces of a third fin structure, and the third replacement region is located on both sides of each first logic gate structure;

when forming the first PD dielectric layer, forming a first logic dielectric layer on the isolation layer in the first logic region;

when forming the first logic dielectric layer, removing a portion of the fin sidewall film formed on a top surface of the third replacement region to expose the top surface of the third replacement region;

when removing the first replacement region of each first fin structure and the portion of the fin sidewall film formed on the sidewall surfaces of the first replacement region, removing the third replacement region of each third fin structure and a portion of the fin sidewall film formed on sidewall surfaces of the third replacement region to form a third trench; and when forming the first source/drain doped layer, forming a third source/drain doped layer in the third trench.

9. The method according to claim 6, wherein the semiconductor substrate further includes a second logic region, including a plurality of fourth fin structures, and used to form a plurality of transistors having a type opposite to a type of the plurality of PD transistors; the isolation layer is also formed on the second logic region of the semiconductor substrate and covers a portion of a top and sidewall surfaces of each fourth fin structure, wherein a portion of each fourth fin structure exposed by the isolation layer includes a fourth replacement region; prior to forming the first PD dielectric layer, the fin sidewall film covers a top and sidewall surfaces of the fourth replacement region of each fourth fin structure, and the method further includes:

prior to forming the fin sidewall film, forming a plurality of second logic gate structures across the plurality of fourth fin structures, wherein each second logic gate structure covers a portion of a top and sidewall surfaces of a fourth fin structure, and the fourth replacement region is located on both sides of each second logic gate structure;

forming a second logic dielectric layer on the isolation layer in the second logic region;

when forming the second logic dielectric layer, removing a portion of the fin sidewall film formed on a top surface of the fourth replacement region to expose the top surface of the fourth replacement region;

removing the fourth replacement region of each fourth fin structure and a portion of the fin sidewall film formed on sidewall surfaces of the fourth replacement region to form a fourth trench; and forming a fourth source/drain doped layer in the fourth trench.

10. The method according to claim 1, wherein removing the first replacement region of the first fin structure and the portion of the fin sidewall film on the sidewall surfaces of the first replacement region includes:

removing the first replacement region of the first fin structure to form a first initial trench; and removing a portion of the fin sidewall film on sidewall surfaces of the first initial trench to form the first trench.

11. The method according to claim 1, wherein:

the fin sidewall film is made of one or more of SiN, SiCN, SiBN, and SiON;

the plurality of first fin structures and the plurality of second fin structures are made of single-crystalline silicon or single-crystalline SiGe; and the first PD dielectric layer is made of $SiO_x$ or a dielectric material with a relative dielectric constant less than 3.9.

12. The method according to claim 1, wherein:

the first source/drain doped layer is formed by a process including an epitaxial growth process.

13. The method according to claim 1, wherein:

a thickness of the fin sidewall film is in a range of approximately 15% to 30% of a width of the first replacement region, wherein the width of the first replacement region is a dimension of the first replacement region in a direction perpendicular to an extending direction of the first fin structure and parallel to a surface of the semiconductor substrate.

14. The method according to claim 13, wherein:

the width of the first replacement region is in a range of approximately 5 nm to 15 nm;

a distance between a first fin structure and the adjacent second fin structure is in a range of approximately 5 nm to 45 nm; and the thickness of the fin sidewall film is in a range of approximately 3 nm to 10 nm.

* * * * *